United States Patent
Wallace et al.

(10) Patent No.: US 8,854,823 B2
(45) Date of Patent: Oct. 7, 2014

(54) HANDLE LATCHING MECHANISM

(75) Inventors: Brian William Wallace, Raleigh, NC (US); John David Swansey, Durham, NC (US); Robert Paul Tennant, Raleigh, NC (US); XiaoSong Xia, Beijing (CN)

(73) Assignee: Lenovo (Singapore) Pte. Ltd., Singapore (SG)

( * ) Notice: Subject to any disclaimer, the term of this patent is extended or adjusted under 35 U.S.C. 154(b) by 667 days.

(21) Appl. No.: 13/049,185

(22) Filed: Mar. 16, 2011

(65) Prior Publication Data
US 2012/0236494 A1 Sep. 20, 2012

(51) Int. Cl.
H05K 7/16 (2006.01)
H05K 7/00 (2006.01)
G06F 1/18 (2006.01)
H05K 7/14 (2006.01)

(52) U.S. Cl.
CPC .............. *H05K 7/1489* (2013.01); *G06F 1/187* (2013.01)
USPC ...................................... 361/726; 361/679.37

(58) Field of Classification Search
USPC ............. 361/679.01, 679.02, 679.31–679.33, 361/679.37–679.39, 724–726
See application file for complete search history.

(56) References Cited

U.S. PATENT DOCUMENTS

| | | | |
|---|---|---|---|
| 6,661,651 B1 * | 12/2003 | Tanzer et al. ............ | 361/679.33 |
| 6,819,555 B2 * | 11/2004 | Bolognia et al. ......... | 361/679.33 |
| 8,035,961 B2 | 10/2011 | Figuerado et al. | |
| 8,246,129 B2 | 8/2012 | Wang et al. | |
| 8,300,398 B2 | 10/2012 | Zhang et al. | |
| 8,553,404 B2 * | 10/2013 | Lin et al. .................. | 361/679.33 |
| 2008/0266781 A1 | 10/2008 | Olesiewicz et al. | |
| 2011/0038110 A1 | 2/2011 | Ikuanmi | |
| 2011/0080705 A1 * | 4/2011 | Figuerado et al. ....... | 361/679.33 |

* cited by examiner

*Primary Examiner* — Bernard Rojas
(74) *Attorney, Agent, or Firm* — Brian J. Pangrle

(57) ABSTRACT

An assembly can include a base with a front side, a back side, a hinge axis, a hinge end, an opposing end and a beveled surface disposed intermediate the hinge end and the opposing end where the beveled surface includes an opening; a handle, configured for rotation about the hinge axis, with a front side, a back side, a hinge end and a swing end where the swing end includes an angled frame that defines an opening for access to a surface; and a latch with a pivot axis, a spring, a prong biased by the spring about the pivot axis and an actuation surface where, for a latched orientation, the prong extends through the opening of the beveled surface and into the opening of the angled frame to access and contact the surface of the handle and to bias the swing end of the handle toward the base. Various other apparatuses, systems, methods, etc., are also disclosed.

20 Claims, 8 Drawing Sheets

HANDLE LATCHING MECHANISM

TECHNICAL FIELD

Subject matter disclosed herein generally relates to technology for a media drive assembly configured, for example, for installation in a server unit.

COPYRIGHT NOTICE

A portion of the disclosure of this patent document contains material to which a claim for copyright is made. The copyright owner has no objection to the facsimile reproduction by anyone of the patent document or the patent disclosure, as it appears in the Patent and Trademark Office patent file or records, but reserves all other copyright rights whatsoever.

BACKGROUND

Conventional server units include bays for installation of media drives such as hard disk drives (HDDs). Such media drives are usually carried in an assembly that allows for installation and removal of a media drive. Often, such an assembly includes a handle that is secured by a latch. Conventional latches may be have sharp geometries (e.g., edges) and protrude, for example, upon unlatching a handle. Sharp and protruding geometry makes using a conventional HDD assembly uncomfortable for a user as a user's fingers might get scratched or cut. Further, for a user with long finger nails, carefully manicured, painted nails, etc., a sharp latch can cause damage. Accordingly, conventional HDD handles have the potential for damage or injury due to their geometry when a user engages in the act of removing or installing a media drive assembly with respect to a unit. Further, a user must usually apply some amount of force to extract a media drive assembly from a unit. When force is applied, risk of damage or injury can increase for both a user and equipment. As described herein, various arrangements provide for reducing or otherwise minimizing damage or injury, for example, when removing or installing a media drive assembly.

SUMMARY

An assembly can include a base with a front side, a back side, a hinge axis, a hinge end, an opposing end and a beveled surface disposed intermediate the hinge end and the opposing end where the beveled surface includes an opening; a handle, configured for rotation about the hinge axis, with a front side, a back side, a hinge end and a swing end where the swing end includes an angled frame that defines an opening for access to a surface; and a latch with a pivot axis, a spring, a prong biased by the spring about the pivot axis and an actuation surface where, for a latched orientation, the prong extends through the opening of the beveled surface and into the opening of the angled frame to access and contact the surface of the handle and to bias the swing end of the handle toward the base. Various other apparatuses, systems, methods, etc., are also disclosed.

BRIEF DESCRIPTION OF THE DRAWINGS

Features and advantages of the described implementations can be more readily understood by reference to the following description taken in conjunction with examples of the accompanying drawings.

DETAILED DESCRIPTION

The following description includes the best mode presently contemplated for practicing the described implementations. This description is not to be taken in a limiting sense, but rather is made merely for the purpose of describing the general principles of the implementations. The scope of the invention should be ascertained with reference to the issued claims.

Figure 1:
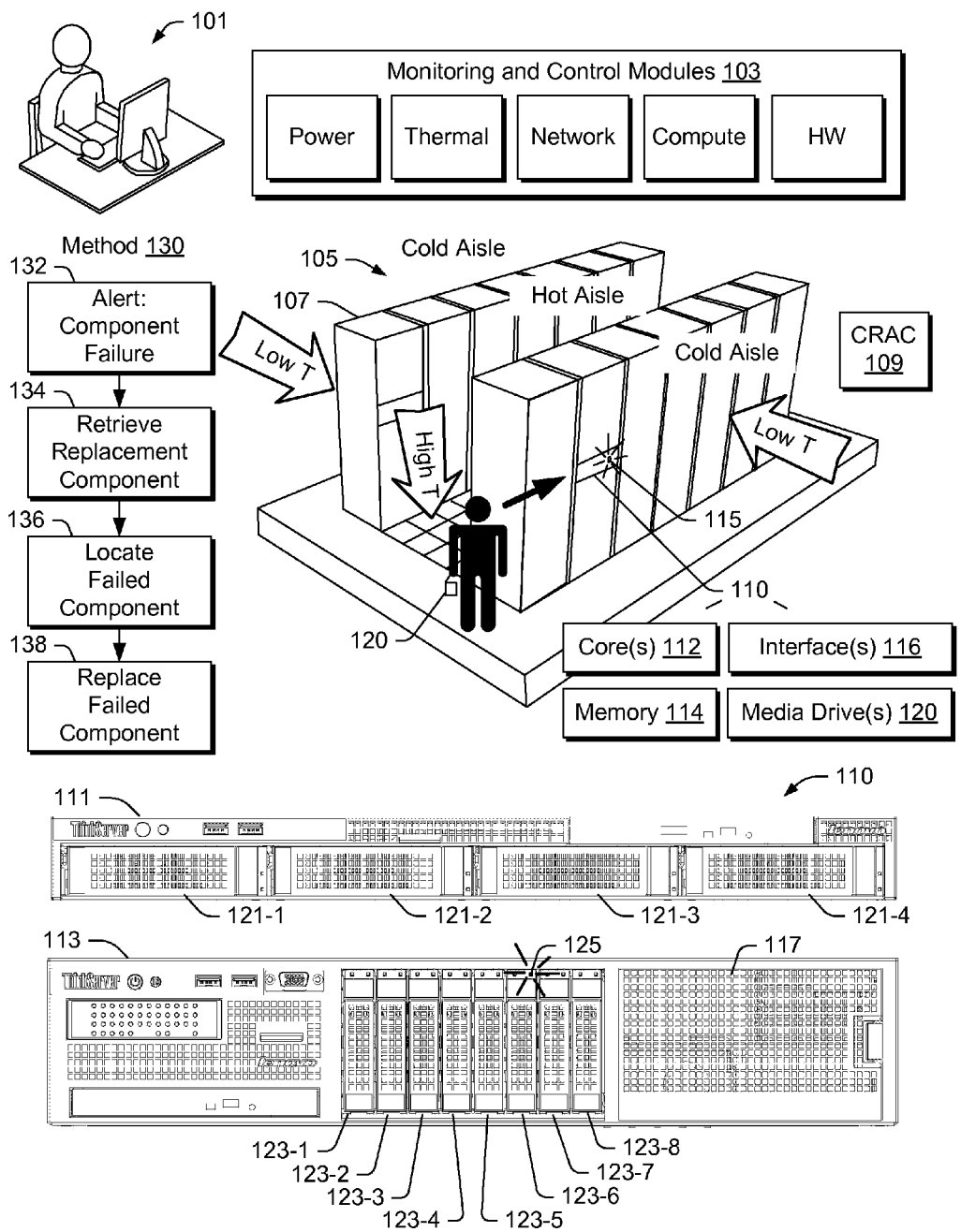
FIG. 1 is a series of diagram related to examples of servers and server operations.

FIG. 1 shows an individual at a control station 101 where the control station 101 may operate in conjunction with one or more modules such as one or more of the monitoring and control modules 103. In the example of FIG. 1, the modules 103 include a power module, a thermal module, a network module, a compute module and a hardware module. The modules 103 may be configured to monitor and control a group of servers 105, which may be arranged in rack towers 107. For example, each of the rack towers 107 may include one or more server unit 110. Each server unit 110 may include one or more processing cores 112, memory 114, one or more interfaces 116 and one or more media drives 120. As an example, each server unit 110 may be configured to access information stored in a media drive 120, transfer accessed information to memory 114, perform computational operations on information in memory 114 and communicate results from computational operations via an interface 116 (e.g., a network interface). As another example, each server unit 110 may be configured to receive information via an interface 116, transfer such information to memory 114 and store such information in a media drive 120. As described herein, each server unit 110 may be configured according to one or more of the foregoing examples or additionally or alternatively according to one or more other manners of operation. Further, as described herein, a server unit includes a server chassis, for example, configured from materials such as metal, plastic, etc., for seating various components.

FIG. 1 also shows a computer room air conditioning (CRAC) unit 109. The CRAC unit 109 is typically a device that monitors and maintains temperature, air distribution and humidity in a network room or data center. In the example of FIG. 1, the CRAC unit 109 may be controlled, monitored, etc., via the one or more modules 103 (e.g., via the control station 101). Mainframes and racks of servers can get as hot as a seven-foot tower of powered toaster ovens, so climate control is an important part of a data center's infrastructure. There are a variety of ways that a CRAC unit can be situated. As an example, a CRAC unit setup can process cooling air and dispense the cooling air (e.g., through an elevated floor). In such an example, cold air flows through the racks (e.g. from "cold aisles") where it picks up heat before exiting from the rear of the racks (e.g., to "hot aisles") and returns to the CRAC unit intake(s). CRAC units in a data center can consume a large fraction of total operational energy. For example, CRAC units may consume 25% or more of the total electricity used by a data center.

FIG. 1 shows two examples of server units 111 and 113. The server units 111 and 113 have substantially rectangular faces configured with bays that seat one or more media drives. As described herein, a bay may refer to an opening defined by at least two walls, which may be configured to receive one or more media drives (e.g., in media drive trays). Each position in a bay configured to receive more than one media drive may be referred to as a media drive bay. Server units such as the units 111 and 113 may be stackable in the towers 107 of the group 105. The example server unit 111 includes four horizontally oriented bays that seat four media drives 121-1, 121-2, 121-3 and 121-4. The example server unit 113 includes a large bay configured with eight vertically oriented media drive bays that seat eight media drives 123-1, 123-2, 123-3, 123-4, 123-5, 123-6, 123-7 and 123-8. The server unit 113 also includes a flush, vented cover 117 that covers an additional unused bay, which upon removal of the cover may optionally seat up to eight additional media drives. As described herein, a media drive may be a hard disk drive (HDD), a solid-state drive, an optical drive or other type of media drive. A HDD may be a standard 2.5 inch drive, a standard 3.5 inch drive or another drive.

Where media drives generate heat, heat is transfer to a cooling fluid (e.g., air), which causes the fluid to rise from an inlet temperature $T_{in}$ to an outlet temperature $T_{out}$. Referring to the examples of FIG. 1, the server unit 111 allows for flow around each media drive 121-1, 121-2, 121-3 and 121-4 as seated in their respective bays. In the server unit 113, heat may be transferred from a media drive (see, e.g., 123-1 to 123-8) to cooling fluid flowing in a gap between adjacent media drives or between a media drive and a wall component of a bay. Heat transfer may be characterized at least in part by the equation: $\Delta Q/\Delta t = h_{plate} A (T_{plate} - T_{in})$. In this equation, the flux of energy ($\Delta Q/\Delta t$) is equal to the heat transfer coefficient for a plate ($h_{plate}$), the area of the plate (A) and the temperature difference between the plate and the cooling fluid ($T_{plate} - T_{in}$). For such an equation, a plate may be a surface of a media drive or other component of a server unit. Heat transfer may optionally be characterized by Reynolds number (ratio of inertial forces to viscous forces), Prandtl number (ratio of kinematic viscosity and thermal diffusivity), Nusselt number (ratio of convective to conductive heat transfer across a surface) or Grashof number (ratio of the buoyancy to viscous force acting on a fluid).

As described herein, velocity of cooling fluid can be important for effective cooling and managing energy costs. In particular, axial velocities (e.g., z direction into a bay) of fluid flowing adjacent a media drive seated in a media drive assembly can be important. As described herein, a media drive assembly can act to increase heat transfer coefficient ($h_{plate}$) compared to a conventional media drive assembly. Heat transfer depends on various factors. Where obstructions to flow exist, flow is impeded, which diminishes momentum and typically velocity (e.g., for constant cross-sectional flow area). Accordingly, as described herein, various media drive assembly components can allow for a more unimpeded flow and enhancement of flux of energy from a media drive to a cooling fluid.

As described herein, various keyed components can ensure that media drive assemblies are installed properly into a bay or bays. For example, for the server unit 113, the media drives 123-1 to 123-8 are seated in a relatively uniform manner whereby clearances and heat generation and transfer patterns may be fairly well-known or otherwise understood a priori. More specifically, where conventional components allow for more than one orientation of a media drive in a bay, the selected orientation may not correspond to the most favorable orientation for purposes of heat transfer (e.g., for cooling). Indeed, one side of a media drive may get hotter than another side and where multiple orientations are possible, an operator may install two hot sides adjacent each other. Such situations can give rise to local temperature control issues, which may compromise operation (e.g., increase risk of failure, decrease longevity, etc.). Accordingly, as described herein, keyed components, optionally in combination with other components or features, can act to decrease uncertainty as to cooling and promote operational certainty.

FIG. 1 shows an example of a method 130 that includes an alert block 132, a retrieval block 134, a locate block 136 and a replace block 138. For example, a monitoring module may detect failure of a component in the group 105 and, per the alert block 132, issue an alert. As described herein, an alert may include lighting a diode associated with the failed component. For example, each tower in a server group (or server farm) may include a series of diodes where an alert causes emission of light from a diode where the light is transmitted via a light pipe (or guide) to a face of a server unit (see, e.g., end of light pipe 115 as associated with the server unit 110). Per the method 130, a retrieval block 134 calls for retrieval of a replacement component, which may be a manual or automated (e.g., robotic) process. Per the locate block 136, the failed component is located, for example, by an operator that may visually inspect the towers and associated server units to locate the particular, failed component. Again, in the example of FIG. 1, the light pipe end 115 facilitates visual location of a failed component. Once located, per the replace block 138, an operator may remove the failed component and replace it with the retrieved replacement component.

In general, the method 130 should be performed in a timely and accurate manner. As described herein, a server unit may include a substantially flush face such that visual inspection of a tower or group of towers readily reveals a status indicator (e.g., diode, end of light pipe, etc.). For example, the server unit 111 or the server unit 113 may be configured with a substantially flush face to avoid blocking emission of light from a status indicator and to allow for viewing of a status indicator from wide angles and many lines of sight. For example, the server unit 113 includes the media drive 123-6 with a status indicator 125 that can emit light in wide angle cone, substantially free from interference from other features of the server unit 113. As described herein, keyed components (e.g., of a bay, a tray, a bay and tray, etc.) that promote uniformity can also decrease visual complexity and allow for an enhanced visual environment that facilitates locating and replacing troubled components.

Referring to the example server units 111 and 113, visual uniformity is enhanced by providing media drive assemblies with vented handles where the vents have a pattern that matches other vent patterns of the server units 111 and 113. For example, the server units 111 and 113 include rectangular air flow passages over various portions of their faces, including the handles of the media drive assemblies 121-1, 121-2 and 121-3 as well was 123-1 to 123-8. Accordingly, when a status light is illuminated, the reduced visual complexity of the vents actually enhances a user's ability to locate the illuminated status light. Further, where the server units 111 and 113 are provided in a dark finish (e.g., black finish), contrast between a face of a server unit and an illuminated status light is enhanced. As mentioned, keyed components can act to ensure that handles face the same direction, which can reduce confusion and expedite replacement of a media drive (e.g., a media drive of a media drive assembly seated in a bay).

Figure 2:
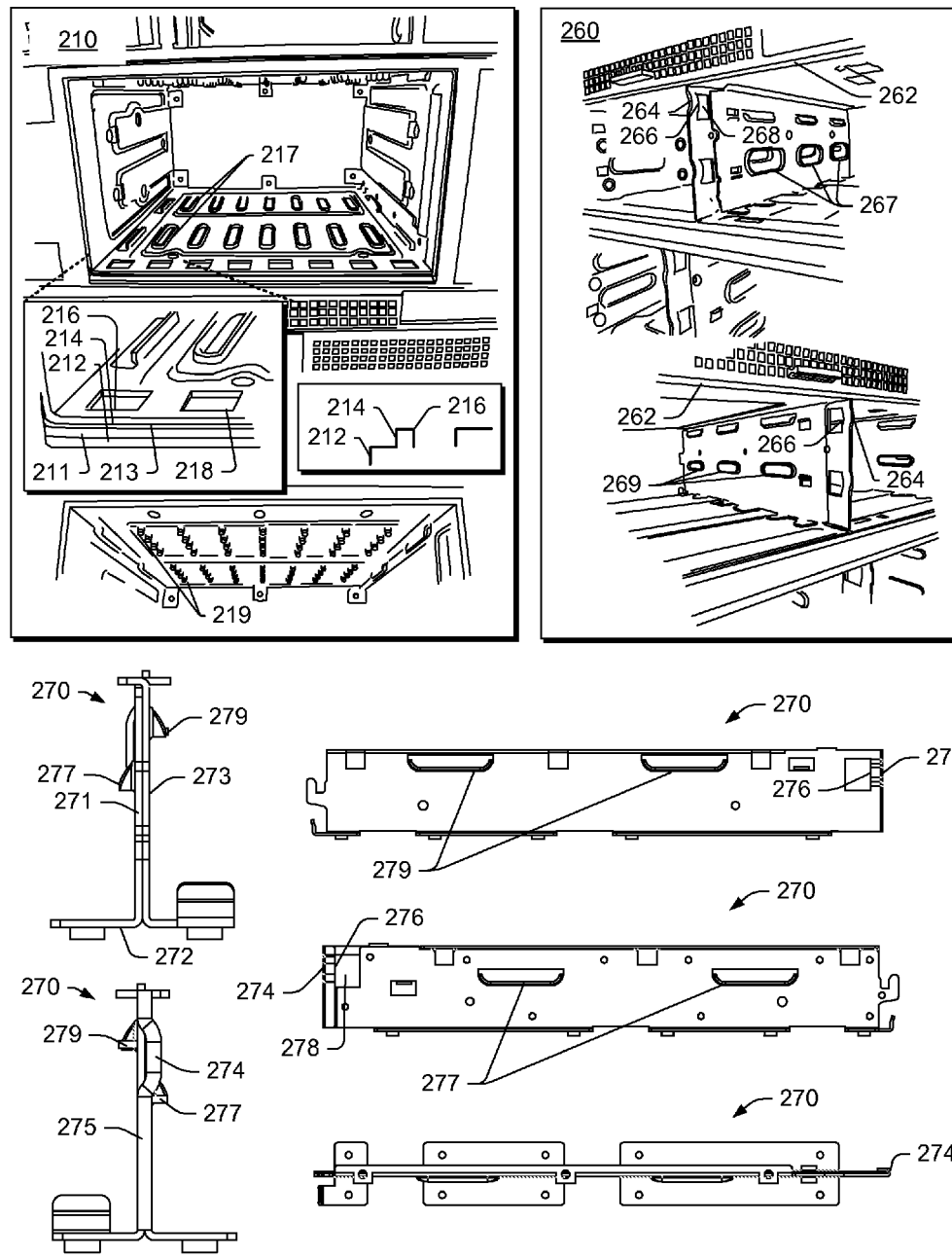
FIG. 2 is a series of diagrams of examples of bays and bay components.

FIG. 2 shows views of some examples of bays 210 and 260 and a bay component 270. The bay 210 is configured to accommodate eight media drives oriented vertically (e.g., eight individual media drive bays) and the bay 260 is configured to accommodate two media drives oriented horizontally between an end wall and an interior wall, two interior walls or two end walls (e.g., two individual media drive bays). The bay component 270 is formed from two plates 271 and 273, bent to form a base 272, and an end cover 275 (e.g., formed by a 180 degree bend of the plate 273) where each of the plates 271 and 273 is configured to abut an edge of a rail attached to a media drive along one or more punch-out portions or protrusions 277 and 279 that extend outwardly from respective plates 271 and 273. As described herein, by bending the plate 273 by 180 degrees, the end thickness is doubled, which provides for additional integrity to a surface 274. As described herein, the surface 274 can be leveraged by an end of a handle to translate a media drive assembly (e.g., to extract a media drive assembly from a bay).

Referring to the bay 210, for each media drive slot, a first front facing surface 212 steps to a shoulder with a recessed, second front facing surface 214. The recessed front facing surface 214 of the shoulder rises to a flat surface which extends inwardly in the bay to a stop surface 216, which may be, for example, an edge of an opening 218. As described herein, for the bay 210, the surface 212 may be a surface of a bezel component 211 while the recessed surface 214 and the stop 216 may be surfaces of a bay component 213 that abuts the bezel component 211. The bay component 213 includes protrusions 217 that separate and define slots where the protrusions 217 are configured to abut at least one edge of a rail attached to a media drive (e.g., one edge of one rail of a media drive and one edge of another rail of another media drive). As described herein, each of the protrusions 217 and each of the openings 218 may optionally be formed by punching a piece of sheet metal. In the example of FIG. 2, a top side of the bay 210 includes a series of nubs 219 that separate and define slots where the series of nubs 219 are configured to abut at least one edge of a rail attached to a media drive (e.g., one edge of one rail of a media drive and one edge of another rail of another media drive).

Referring to the bay 260, a first front facing surface 262 steps to a shoulder with a recessed, second front facing surface 264. The recessed front facing surface 264 traverses to a curved surface that extends inwardly to a stop 266, which may be, for example, an edge of an opening 268. As mentioned, the bay 260 is configured to receive two media drives, stacked and oriented horizontally. The bay 260 includes sets of protrusions 267 on one side and sets of protrusions 269 on another side. For example, a lower set of protrusions provide for alignment of an upper edge of a rail attached to a first media drive seated in a lower slot (e.g., a lower individual media drive bay) as well as alignment of a lower edge of another rail attached to a second media drive seated in an upper slot (e.g., an upper individual media drive bay) while an upper set of protrusions provide for alignment of a lower edge of the rail attached to the second media drive seated in the upper slot.

Various features of the bay component 270 appear correspondingly in the bay 260. For example, the surface 274 corresponds to the recessed surface 264, the stop 276 corresponds to the stop 266, and the opening 278 corresponds to the opening 268. Noting that the bay 260 includes one set of features for each slot. As shown in the example of FIG. 2, by folding an end of the plate 273 180 degrees, the thickness is doubled and the stop 276 may be formed or strengthened. As described herein, such a fold (or bend) can provide for the surface 274 and the stop 276, with sufficient integrity to lock a media drive assembly in a bay (i.e., via the stop 276) and to extract a media drive assembly from a bay (i.e., via the surface 274), for example, to translate the media drive assembly a distance that decouples a connector.

Figure 3:
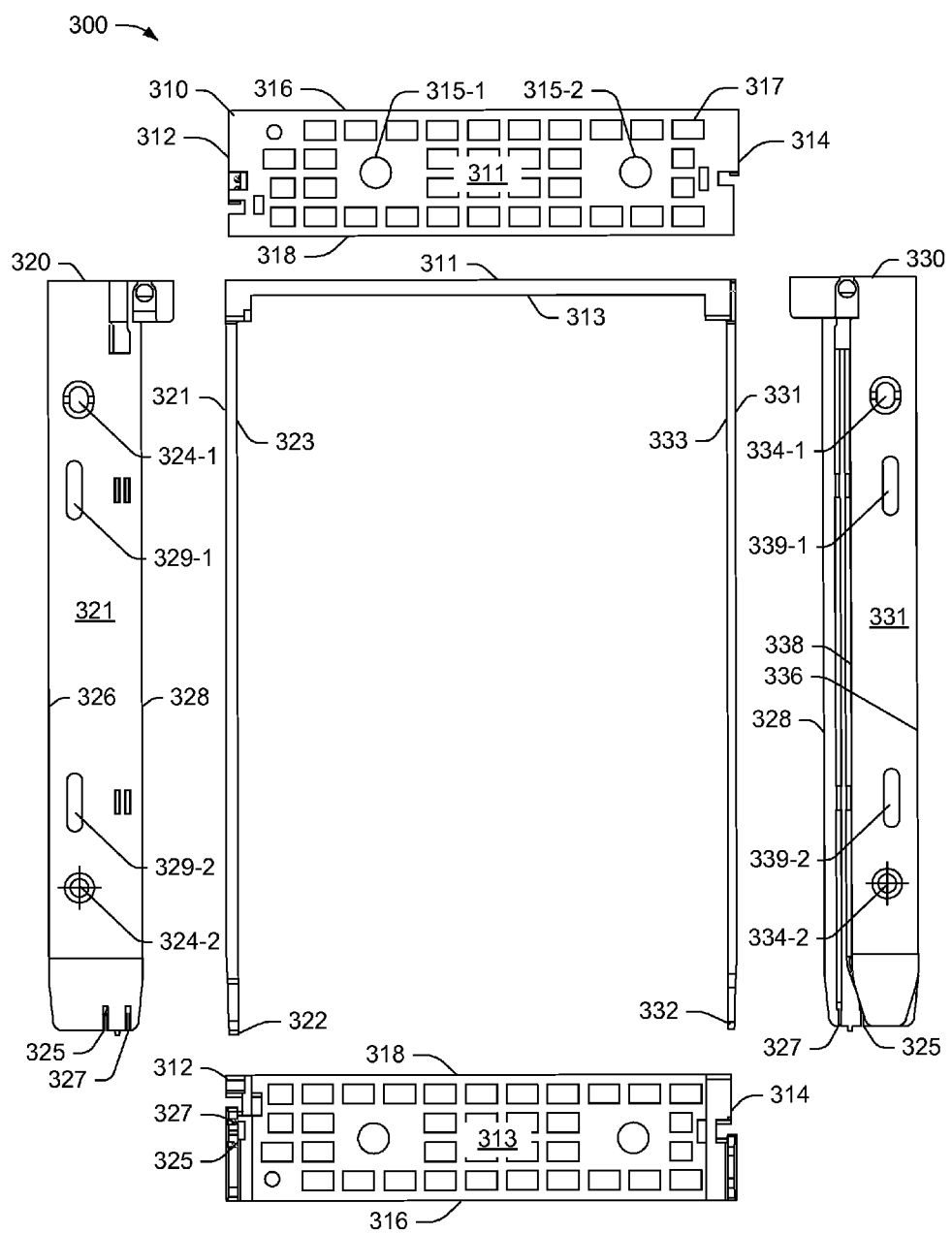
FIG. 3 is a series of views of an example of a tray for a media drive.

FIG. 3 shows various views of an example of a tray 300 with rails 320 and 330 configured for attachment to a media drive. In the example of FIG. 3, the tray 300 includes a front plate 310 with a front surface 311 and a back surface 313. As shown, the rails 320 and 330 extend outwardly from the back surface 311 perpendicular to a plane defined by the front plate 310. The front plate 310 includes opposing sides 312 and 314, a top edge 316 and a bottom edge 318. The front plate 310 includes features 315-1 and 315-2 for attachment to a handle unit (e.g., to facilitate installation and removal of a media drive from a bay). The front plate 310 also includes passages 317 for flow of air, for example, for cooling a media drive secured in the tray 310 and seated in a bay.

In the example of FIG. 3, the rails 320 and 330 are different. Specifically, one rail has a different configuration than the other rail; accordingly, the rails are asymmetric (i.e., not merely right hand/left hand mirror images). As shown, the rail 320 is larger with a greater height than the rail 330. Further, the rail 320 includes at least one light guide 325 and 327 (e.g., for transmitting light signals as to status of a media drive, etc.). The rail 320 has a free end 322, a bay side surface 321, a media drive side surface 323, a lower edge 326 and an upper edge 328. In the example of FIG. 3, the rail 320 includes attachment features 324-1 and 324-2 as well as openings 329-1 and 329-2.

As shown, the rail 330 is smaller with a smaller height than the rail 320. The rail 330 has a free end 332, a bay side surface 331, a media drive side surface 333, a lower edge 336 and an upper edge 338. In the example of FIG. 3, the rail 330 includes attachment features 334-1 and 334-2 as well as openings 339-1 and 339-2.

As mentioned, conventional Hard Disk Drive (HDD) assemblies for hot-swap have latching mechanisms that are generally sharp and protruding. Such sharp and protruding geometry makes using such conventional HDD trays uncomfortable for a user. Arrangement of a latch and a handle of such a conventional HDD assembly some potential for injury due to the geometry and when a user engages in an act of removing and installing the HDD assembly.

As described herein, a media drive assembly (e.g., a HDD assembly) can be configured for a hot-swap. For example, to remove such an assembly, a user presses on a flat flush surface of a release button where the applied pressure causes an internal latch to release. In various examples, a handle is biased by a spring about a hinge axis, which causes the handle to rotate outward to an "open" position with respect to a base. In this open position, the geometry of the base and the handle present a convenient recess for the user to reach into with his or her finger or fingers and grasp the handle. The recess guides the user's hand via smooth surfaces (e.g., for proper positioning, alignment and grip). As described herein, a release catch (e.g., prong) can be placed at an area of the recess to prevent or minimize user contact.

Figure 4:
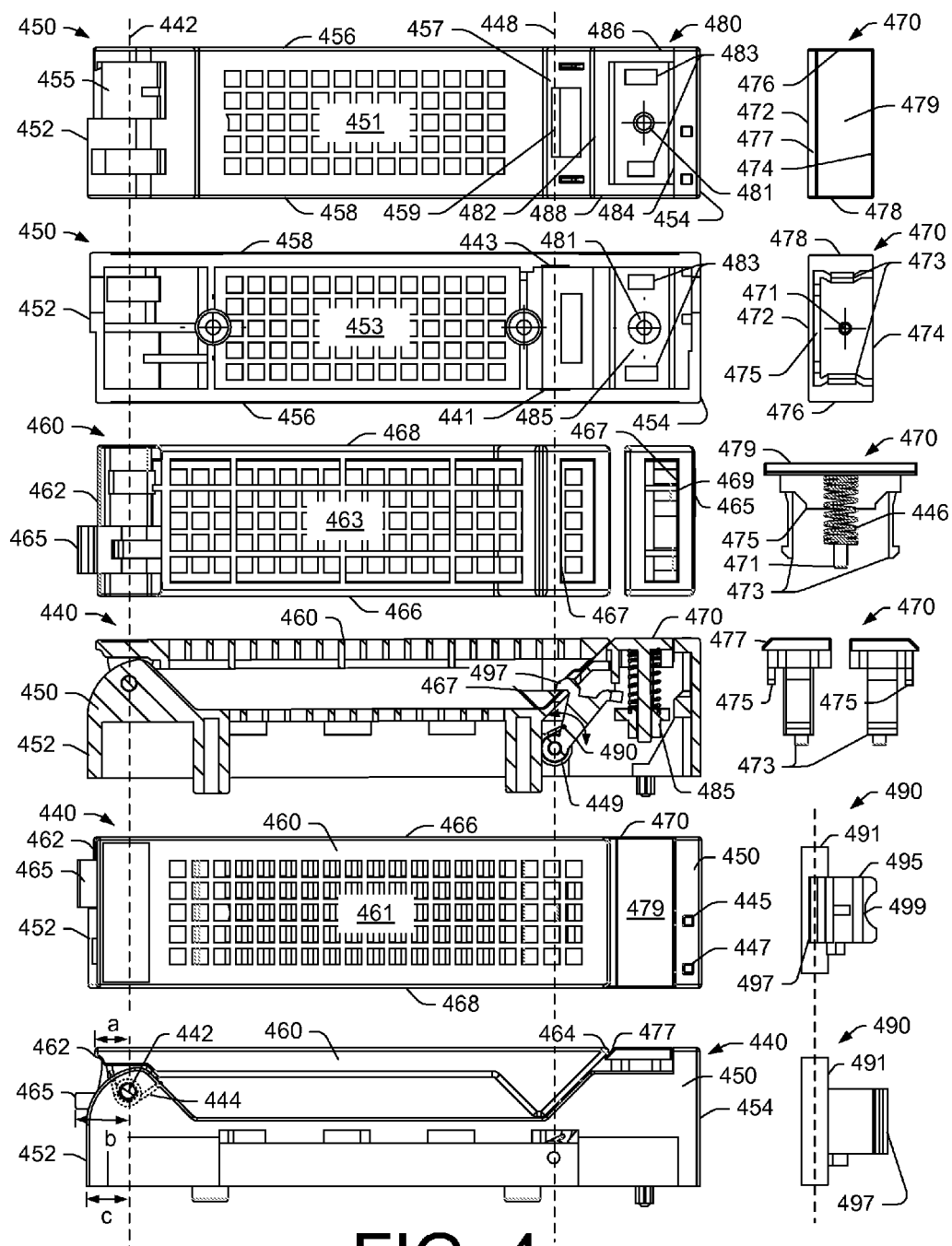
FIG. 4 is a series of views of an example of a handle unit for a media drive assembly.

FIG. 4 shows an example of a handle unit 440, which is an assembly of various components. In the example of FIG. 4, the handle unit 440 includes a base 450, a handle 460, a button 470 and a latch 490. As shown, the base 450 includes a chamber 480 for seating the button 470 and the latch 490, which upon depression of the button 470 a certain distance, the button 470 contacts the latch 490 for release of a swing end 462 of the handle 460 such that the handle 460 can rotate with respect to the base 450 about a hinge axis 442. As shown in FIG. 4, a pivot axis 448 is shown for the latch 490. In the side views, the dashed lines for the hinge axis 442 and the pivot axis 448 passes through the end of the axes, respectively. As described herein, an axis may be defined by a pin, pins or other component(s), for example, the assembly 440 may include a hinge pin along the hinge axis 442 and a latch pin along the pivot axis 448.

The base 450 include a front side 451, a back side 453, a hinge end 452 and an opposing end 454, which may be configured as a flat end. Disposed intermediate the hinge end 452 and the end 454 is a latch surface 457, which is set at an angle (e.g., beveled). In the example of FIG. 4, the base 450 also includes light guides 445 and 447, which may cooperate with the light guides 325 and 327 of the tray 300 of FIG. 3.

In the example of FIG. 4, the handle 460 is shown as including a front side 461 and a back side 463, disposed between a hinge end 462 and the swing end 464. Further, the handle 460 includes a surface 467 (e.g., a latching surface which may be part of a column) that cooperates with a prong 497 of the latch 490 to maintain the handle 460 in a closed orientation with respect to the base 450. The handle 460 also includes an optional locking tab 465, which may be configured to cooperate with a stop of a bay (see, e.g., the stops 216, 266 and 276 of FIG. 2) to lock an assembly in a bay.

The chamber 480 defined by the base 450 accommodates the button 470 and the latch 490. The chamber 480 includes features for retention and operation of the button 470 such as an opening 481, a pair of retainer openings or sockets 483 (e.g., of different widths), a retainer surface 485 (e.g., a button stop), a top latch side 482, an opposing side 484, an upper side 486 and a lower side 488. The chamber 480 further includes sockets 441 and 443 for receipt of respective ends of the latch 490 and for pivoting of the latch 490 about the pivot axis 448. In the example of FIG. 4, a spring 449 acts to bias the latch 490 in a counter-clockwise direction with respect to the base 450 about the pivot axis 448.

In the example of FIG. 4, the button 470 includes a pair of long edges 472 and 474, a pair of short edges 476 and 478, a front side 479 and a beveled edge 477 (e.g., set at a bevel angle) disposed between the long edge 472 and the front side 479. Extending from a back side, the button 470 includes a stem 471, a pair of retainers 473 (e.g., of different widths), and a latch contacting surface 475.

In the example of FIG. 4, the latch 490 includes a shaft portion 491, an actuation surface 495, a prong 497 and an edge 499 with a cut-out (e.g., semi-circular in shape) to accommodate the button 470 as seated in the chamber 480 with a button spring 446 (e.g., consider a cylindrical coil spring). As indicated in FIG. 4, the latch 490 can rotate about its shaft portion 491, for example, responsive to contact with the handle 460 or contact with the latch contacting surface 475 of the button 470.

As shown in a cross-sectional view of FIG. 4, in a closed or locked (or latched) orientation of the handle 460 with respect to the base 450, the prong 497 of the latch 490 enters an opening 469 defined by a frame of the swing end 464 of the handle where the prong 497 contacts a surface 467 (e.g., defined by the frame or otherwise accessible via the opening 469). Again, as mentioned, for the example of FIG. 4, the spring 449 biases the latch 490 in a counter-clockwise direction such that the prong 497 biases the swing end 464 of the handle 460 against a front side 451 of the base 450. In the side views of the assembly 440 of FIG. 4, contact between the handle 460 and the base 450 is shown where various angled surfaces align. For example, the frame of the swing end 464 of the handle 460 has an angle that is complimentary to an angle of the latch surface 457 of the base 450. Further, the angle of the bevel 477 of the button 470 is aligned with that of the latch surface 457 and complimentary to the angle of the frame of the swing end 464.

In the example of FIG. 4, the button 470 includes a latch contacting surface 475 extending outwardly away from a back side of the button 470 where, for an un-depressed orientation, the spring 446 biases the retainers 473 against the button stop 485 to maintain a gap between the latch contacting surface 475 and the actuation surface 495 of the latch 490. As described herein, the gap is, at times, referred to herein as a "pre-travel" gap. Referring to FIG. 4, the button 470 may be depressed a pre-travel distance without affecting the latch 490; thus, maintaining the handle 460 in a closed or locked orientation with respect to the base 450.

As described herein, the handle 460 is configurable in a locked orientation and an unlocked orientation with respect to the base 450 where the locked orientation corresponds to a locked angle of rotation of the handle 460 about the hinge axis 442 having an end of the locking tab 465 rotated outwardly away from the hinge end 452 of the base 450, the swing end 464 of the handle 460 rotated inwardly toward the base 450 and the hinge end of the base 452 extending outwardly beyond the hinge end 462 of the handle 460 and where the unlocked orientation corresponds to an unlocked angle of rotation of the handle 460 about the hinge axis 442 having an end of the locking tab 452 rotated inwardly toward the hinge end 452 of the base 450, the swing end 464 of the handle 460 rotated outwardly away from the base 450 and the hinge end 462 of the handle 460 extending outwardly beyond the hinge end 452 of the base 450.

FIG. 4 shows distances a, b and c, which correspond to dimensions measured from the hinge axis 442 to the hinge end 462 of the handle 460 ("a"), the hinge axis 442 to an end of the locking tab 465 ("b") and from the hinge axis 442 to the hinge end of the base 452 ("c"). Accordingly, in the locked orientation, the hinge end 452 of the base 450 extends outwardly beyond the hinge end 462 of the handle 460 (i.e., c>a). Such an arrangement allows for the hinge end 462 of the handle 460 to contact a recessed surface (see, e.g., surfaces 214, 264 or 274) of a bay component and allow the handle 460 to be flush with a surface of a server rack or unit (see, e.g., surfaces 212 or 262).

Also shown in the example of FIG. 4, the locking tab 465 is positioned along an upper half of the assembly 440 and opposite the side with one or more status indicators 445 and 447 (see, e.g., light guides 325 and 327 of FIG. 3). Such an arrangement of features allows for the smaller rail 330 (e.g., without the light guides) to be positioned below the surface 274 of the bay component 270 (e.g., aligned per the protrusion 277) where the surface 274 can be curved inwardly towards the bay and available as a contact point for leverage by a biasing surface of the hinge end 462 of the handle 460. As shown in the bay 260 of FIG. 2, a bay component may include one such surface per slot, which, upon assembly of a bay, becomes a recessed surface (e.g., in comparison to the surface 262).

In the example of FIG. 4, a spring 444 biases the handle 460 about the hinge axis 442 with respect to the base 450. Accordingly, upon release of the swing end 464, the spring 444 causes the swing end 464 of the handle 460 to swing outwardly, rotating about the hinge axis 442 such that the hinge end 462 rotates inwardly and the locking tab 465 rotates inwardly to a chamber 455 at the hinge end 452 of the base 450.

As described herein, an assembly can include a base with a front side, a back side, a hinge axis, a hinge end, an opposing end and a beveled surface disposed intermediate the hinge end and the opposing end where the beveled surface includes an opening; a handle, configured for rotation about the hinge axis, that includes a front side, a back side, a hinge end and a swing end where the swing end includes an angled frame that defines an opening for access to a surface; and a latch that includes a pivot axis, a spring, a prong biased by the spring about the pivot axis and an actuation surface where, for a latched orientation, the prong extends through the opening of the beveled surface and into the opening of the angled frame to access and contact the surface and to bias the swing end of the handle toward the base.

Figure 5:
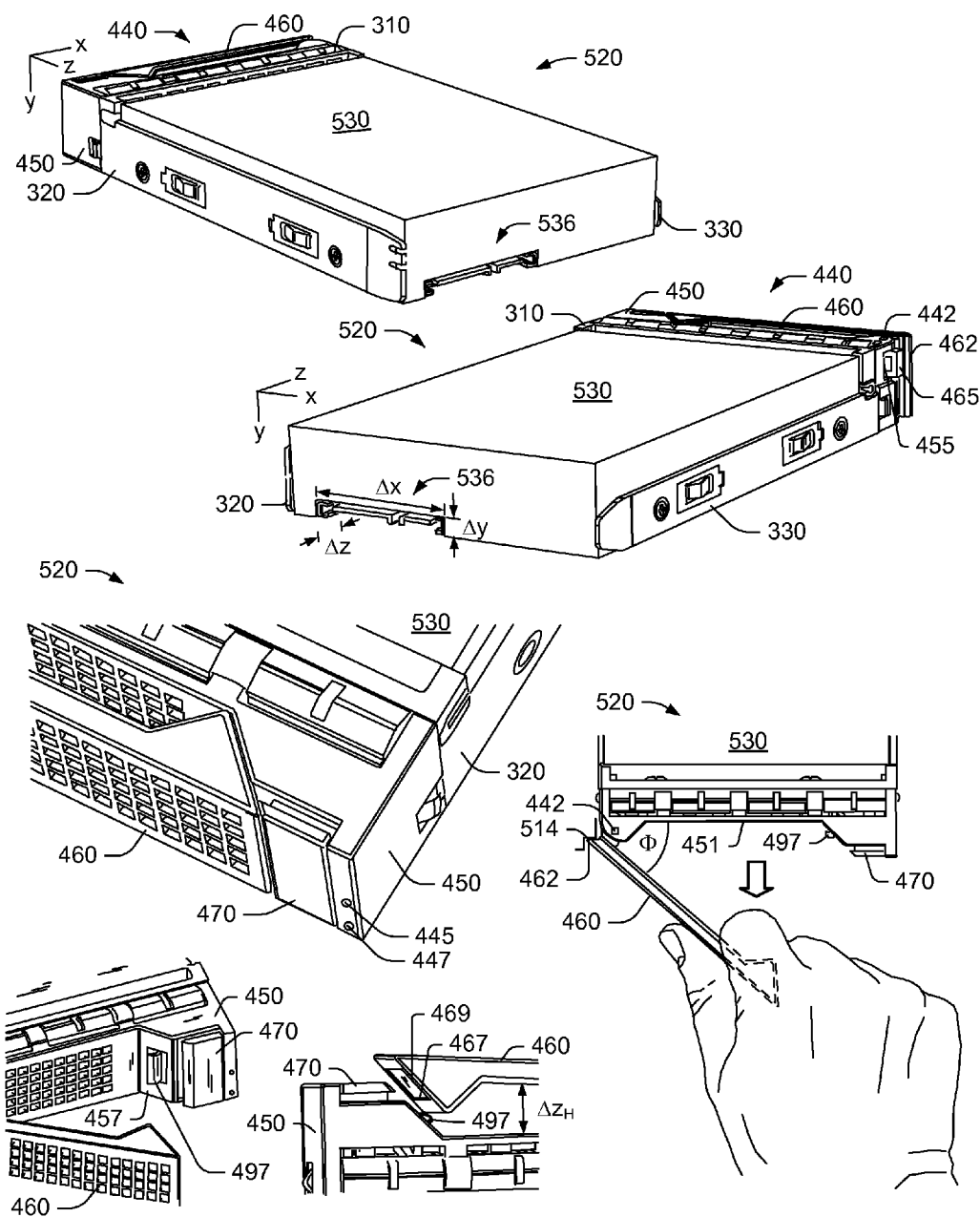
FIG. 5 is a series of perspective views of an example of an assembly with a media drive.

FIG. 5 shows various perspective views of an example of an assembly 520 that includes a media drive 530. The assembly 520 includes the tray 300 and the handle unit 440. In the example of FIG. 5, the rail 330, which has a smaller height (e.g., along a y dimension) compared to the rail 320, is attached to a side of the media drive 530 that corresponds to the hinge end 462 of the handle 460, as well as the locking tab 465.

In the example of FIG. 5, the media drive 530 is shown as having a back side connector or connectors 536 configured for connecting the media drive 530 to a power source, information bus, etc. In the example of FIG. 5, the connector 536 has a depth dimension ($\Delta z$), which represents a sliding distance, for example, between two components from being in contact with each other to fully connected or from fully connected to being disconnected from each other.

As described herein, a server unit or chassis can include one of more types of bays for receipt of one or more types of media drives where each drive is carried in a tray with a handle unit, sometimes referred to as a caddy. Such media drives may optionally be of a so-called "small form factor" (SFF), for example, consider the SFF 3.5 inch or SFF 2.5 inch standards, which are common for hard disk drives (HDDs).

A perspective front side view of the assembly 520 shows flush alignment of the base 450, the handle 460 and the button 470 (e.g., for a closed or locked or latched orientation of handle 460 with respect to the base 450). Two perspective views of the assembly 520 show an open or unlocked or unlatched orientation of the handle 460 with respect to the base 450. Also shown is the latch surface 457 of the base 450, the prong 497 of the latch 490 and the surface 467 accessible via the opening 469 of the handle 460.

FIG. 5 also shows a top view of the assembly 520 with the swing end 464 of the handle 460 rotated (swung) outwardly about the hinge axis 442 (e.g., an angle $\Phi$). As shown, the hinge end 462 of the handle 460 is in contact with a front facing recessed surface 514 (see, e.g., surfaces 214, 264 and 274 of FIG. 2). In the example of FIG. 5, the handle 460 includes a grip portion at the swing end 464 for gripping by a hand. The grip portion of the handle 460 has a substantially triangular shape formed by a column that forms part of the frame that defines the opening 469 and the swing end 464. An inwardly facing surface of the grip is shown as being substantially parallel to the front side 451 of the base 450.

As described herein, various features of an assembly provide for user comfort. For example, the shape of the prong 497 and its location with respect to the latch surface 457 of the base 450 act to avoid scratching a user's fingers (e.g., or finger nails). In particular, the prong 497 is relatively smooth on its outwardly facing surface when in the unlatched orientation. Further, the prong 497 is of a sufficient length to avoid catching a finger, a problem experienced with short prongs (e.g., that readily expose a user's fingers to sharp ends). Also consider the dimension $\Delta z_H$, shown in one of the perspective views of FIG. 5, which indicates an unlatched distance for insertion of a user's finger to open the handle 460 more fully (e.g., for an angle less than the angle $\Phi$). As shown, the shape of the grip portion of the handle 460 acts to avoid contact between a user's finger and the prong 497.

As described herein, a media drive assembly may be optionally configured for a hot-swap. For example, to remove such an assembly, a user presses on a flat flush surface of a release button (see, e.g., the button 470 in FIG. 5) where the applied pressure causes an internal latch to release (see, e.g., the prong 497 in FIG. 5). In various examples, a handle is biased by a spring about a hinge axis (see, e.g., the axis 442 and the spring 444 in FIG. 4), which causes the handle to rotate outward to an "open" position with respect to a base (see, e.g., the distance $\Delta z_H$ in FIG. 5). In this open position, the geometry of the base and the handle present a convenient recess for the user to reach into with his or her fingers and grasp the handle where the recess can guide a user's hand toward various surfaces via smooth surfaces of the assembly (e.g., to provide for proper hand/handle alignment and grip). As described herein, a release catch (e.g., prong) can be placed at an area of a recess to prevent or minimize user contact.

In the example of FIG. 5, a space exists between the handle 460 and the base 450, which is enlarged upon release of the swing end 464 of the handle 460 (e.g., by depressing the button 470). The handle 460 includes a grip portion that includes the swing end 464 and a frame that defines the opening 469 (e.g., as configured for receipt of the latch). As shown, the triangular shaped grip portion of the handle 460 is formed by the angled frame that defines the opening 469 (e.g., first leg), another angled side or frame (e.g., second leg) and the front side 461 of the handle 460 (e.g., third leg). The surfaces of these grip features may be smooth to improve feel and avoid injury or damage to fingers (e.g., including finger nails). In the example of FIG. 5, the grip portion is grasped by a right hand (e.g., alternatively a left hand if upside down) with the index finger contacting one of the legs and the thumb contacting the front side 461 of the handle 460. Such a grasp allows for application of force to extract the assembly 520 in a direction shown by an arrow. The handle 460 may be configured to open to a pre-defined angle, for example, where a leg of the grip is substantially parallel to the front side 451 of the base 450.

Figure 6:
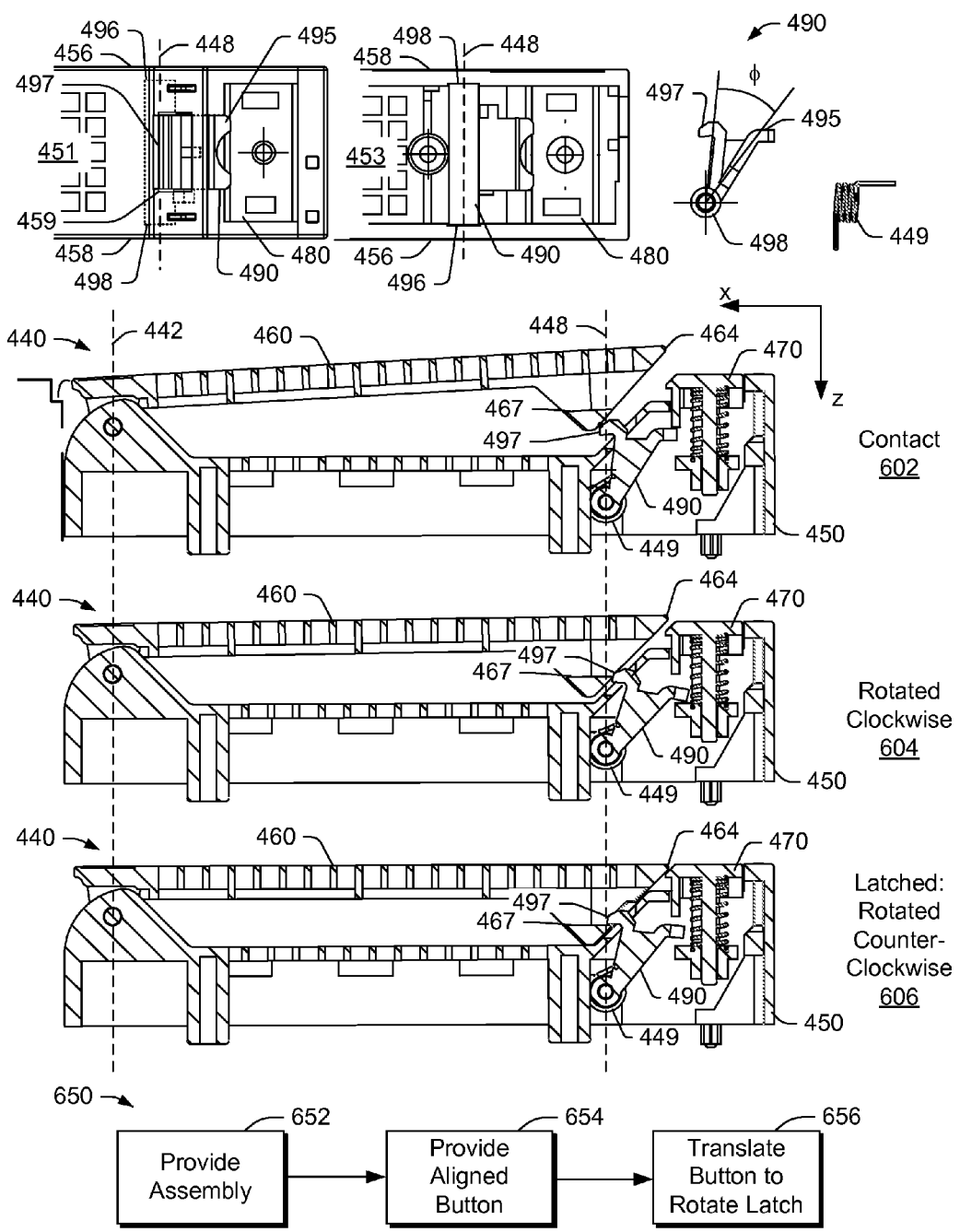
FIG. 6 is a series of views of an example of an assembly and a block diagram of a method.

FIG. 6 shows various views of the base 450 and the latch 490 along with a series of three cross-sectional views of the assembly 440 along with a block diagram of an example of a method 650. The three cross-sectional views illustrate a contact state 602, a clockwise rotation state 604 and a latched, counter-clockwise state 606 of the latch 490 with respect to the base 450 and the handle 460.

A front view of the base 450 and the latch 490 shows the prong 497 extending through the opening 459 of the latch surface 457 of the base 450. As shown, the actuation surface 495 of the prong 490 extends to a button seat portion of the chamber 480. In a back view of the base 450 and the latch 490, ends 496 and 498 of a cylindrical portion of the latch 490 are shown seated in sockets 456 and 458 of the base 450. As described herein, a spring such as the spring 449 may be inserted in the chamber 480 to bias the prong 490 for rotation about the pivot axis 448. In the example of FIG. 6, the prong 497 and the actuation surface 495 of the prong 490 are disposed at an angle $\phi$, which may be measured from the pivot axis 448 or another point.

For the contact state 602, the prong 497 of the latch 490 is shown as being in contact with the handle 460. As indicated, contact occurs between an angled surface of the frame of the swing end 464 of the handle 460 and a surface of the prong 497. The angles of these surfaces, particularly that of the frame surface for the given angle of the handle 460 with respect to the base 450, acts to move the prong 490 in a clockwise direction about its pivot axis 448. For the rotated state 604, the latch 490 is rotated clockwise, almost to a degree that allows the prong 497 to clear an edge of the opening 469 of the handle 460. For the latched, rotated state 606, the latch 490 is rotated counter-clockwise such that a surface of the prong 497 is in contact with the surface 467 of the handle 460. In the example of FIG. 6, the spring 449 is configured to bias the latch 490 in a counter-clockwise direction such that the latch 490 secures the handle 460 with respect to the base 450. Further, as shown in the latched state 606, a gap exists between the button 470 and the latch 490, which may be referred to as a pre-travel gap that allows for accidental or unintended depression of the button 470 without rotating the latch 490 and releasing the swing end 464 of the handle 460.

In the example of FIG. 6, the method 650 includes a provision block 652 for providing a media drive assembly in a latched orientation where the assembly includes a handle rotatable about a hinge axis of a base and where a prong of a pivotable latch biases a swing end of the handle toward a front side of the base; a provision block 654 for providing a button in a chamber of the base, the button aligned with a front side of the handle and configured to translate in the chamber to contact the pivotable latch for rotating the prong and unlatching the swing end of the handle; and optionally a translation block 656 for translating the button for rotating the latch to unlatch the swing end of the handle.

As described herein, a method can include providing a button with a beveled edge disposed at an angle complimentary to an angle of a frame of a swing end of a handle where, for a latched orientation, a prong of a pivotable latch is seated in an opening defined by the frame.

As described herein, a method can include providing an assembly with a light guide for transmitting a status signal to a face of the base. In such an example, a method may include transmitting a status signal via the light guide where the status signal calls for replacing a media drive carried by the assembly, at least in part by translating the button to contact the pivotable latch for rotating the prong and unlatching the swing end of the handle.

As described herein, a method can include rotating a handle about a hinge axis of a base; forcing a surface of an angled frame of the handle against a prong of a pivotal latch housed by the base to rotate the pivotal latch in a first rotational direction until the prong clears an interior edge of the angled frame; upon clearing the interior edge, rotating the prong of the pivotal latch in a second rotational direction and into a window (e.g., opening) defined by the angled frame; and biasing the prong against an interior surface of the angled frame to secure the handle with respect to the base. Such a method may further include depressing a button to contact an actuation surface of the pivotal latch to rotate the pivotal latch in the first rotational direction and out of the window defined by the angled frame. Such a method can include rotating a prong of a pivotal latch in the second rotational direction to draw the frame toward the base. In such an example, the rotating the prong of the pivotal latch in the second rotational directions may further rotate a tab (e.g., a locking tab) at the hinge end of the handle outwardly away from the base.

Figure 7:
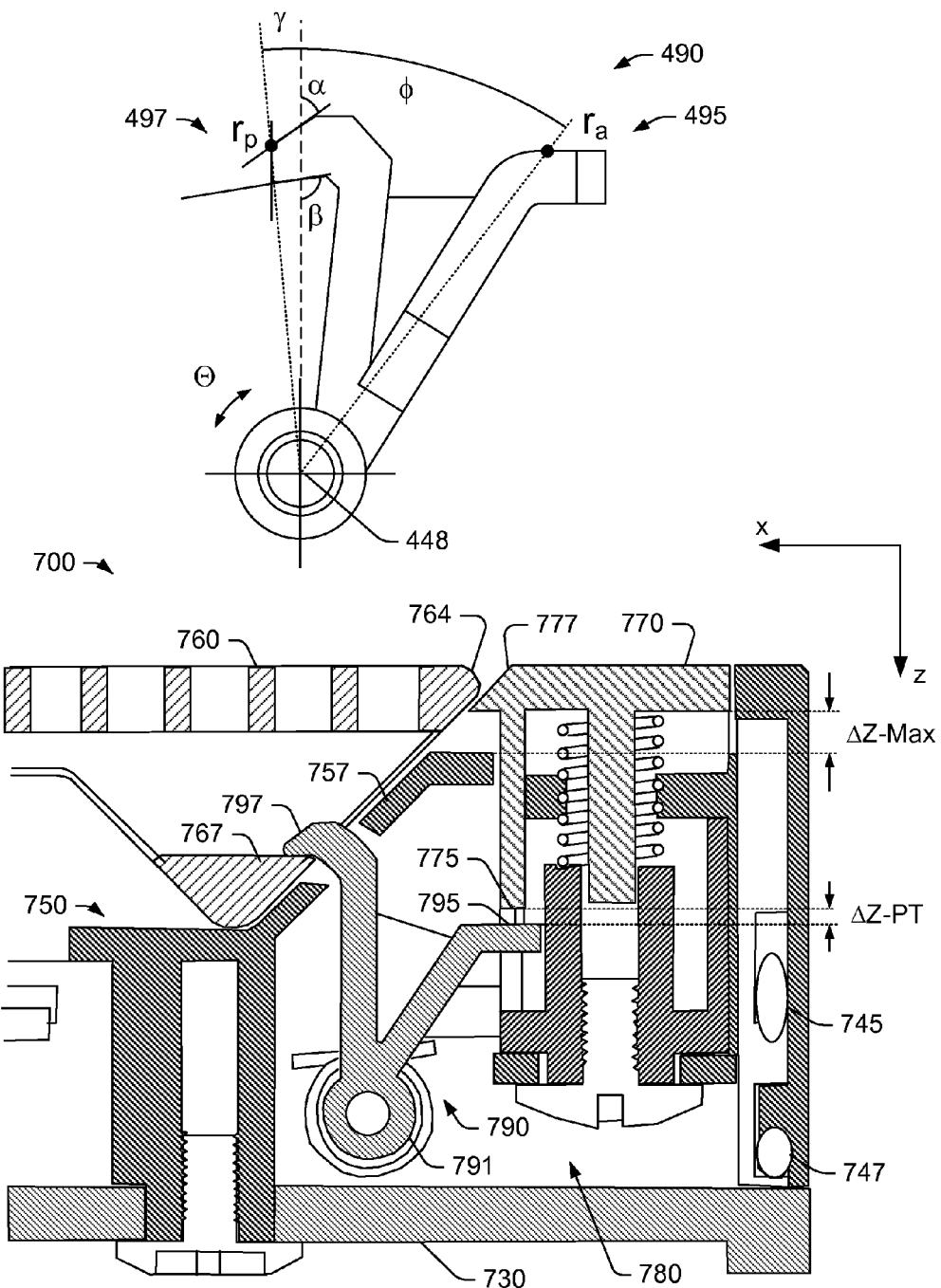
FIG. 7 is a side view of a latch and a cross-sectional view of an example of an assembly.

FIG. 7 shows a side view of the latch 490 and a cross-sectional view of an example of an assembly 700. The latch 490 is shown in conjunction with various angles alpha ($\alpha$), beta ($\beta$), gamma ($\gamma$) and small phi ($\phi$). The angle phi represents an angle between the actuation surface 495 and the prong 497, for example, defined about the pivot axis 448 and by two points at radii $r_p$ (prong) and $r_a$ (actuation surface). The angle alpha represents an angle of a slope of a surface of the prong 497 that is configured to contact an angled frame surface of a handle. The angle beta represents an angle of a slope of a surface of the prong 497 that is configured to contact an interior surface of the handle, accessible via an opening or window defined by an angled frame. The angle gamma represents an angle between a vertical line drawn through the pivot axis 448 and the line of the angle phi (e.g., consider the point at radius $r_p$). Also shown in FIG. 7 is an angle theta ($\Theta$), which represents a rotational angle of the latch 490 about the pivot axis 448. As described herein, the configuration of the prong 497 of the latch 490 allows for ease of closure of a handle with respect to a base.

In the example of FIG. 7, the assembly 700 includes a tray 730, a base 750, a handle 760, a button 770 seated in a chamber 780 that includes a button seat, and a latch 790. In the view of FIG. 7, the assembly 700 is also shown as including one or more light guides 745 and 747, which may transmit a light signal (e.g., status signal) to a face of the assembly 700.

In the example of FIG. 7, the latch 790 includes various angles, for example, as referred to in the description of the latch 490. In particular, a prong 797 of the latch 790 includes the angles alpha and beta for sloped surfaces that assist in latching and securing a swing end 764 of the handle 760. In the example of FIG. 7, various surfaces are aligned such as a beveled surface or edge 777 of the button and a portion of a frame of the handle 760, a beveled or angled surface 757 of the base and at least a portion of the frame of the handle 760.

In the example of FIG. 7, a pre-travel gap $\Delta Z\text{-PT}$ exists, which is a distance that the button 770 may be depressed in the button seat without actuating the latch 790. More specifically, the pre-travel gap $\Delta Z\text{-PT}$ is defined as existing between a latch contacting surface 775 of the button 770 and an actuation surface 795 of the latch 790. In the illustrated resting state of the assembly 700, a front surface of the base 750, a front surface of the handle 760 and a front surface of the button 770 may be aligned (e.g., across the x-dimension with respect to a z-coordinate). In the example of FIG. 7, a maximum travel distance $\Delta Z\text{-Max}$ is defined between a surface of the button 770 and a surface of the base 750. As described herein, by depressing a button a maximum travel distance, a latch is actuated to unlatch a handle. Further, a pre-travel distance is a fraction of the maximum travel distance. In various examples, a pre-travel distance may be about 50% or less of a maximum travel distance. In general, a greater pre-travel distance (e.g. in absolute terms) reduces the less risk of unintended release of a locked handle.

As described herein, an assembly can include one or more processors configured to execute instructions stored in memory; memory configured to store processor-executable instructions; a media drive configured to store information and to respond to instructions executed by at least one of the one or more processors; and a subassembly configured to carry the media drive. In such an example the subassembly can include: a handle, configured for rotation about a hinge axis, where the handle includes a front side, a back side, a hinge end and an opposing swing end where the swing end has an angled frame that defines an opening for access to a surface; a latch that includes a pivot axis, a spring, a prong biased by the spring about the pivot axis and an actuation surface where, for a latched orientation, the prong extends into the opening of the angled frame to secure the latch end of the handle; and a handle release button configured to contact the actuation surface of the pivotal latch and to rotate the prong out of the opening of the angled frame to release the latch end of the handle.

As described herein, a handle can include a grip or grip portion formed in part by an angled frame. As described herein, an angled frame may include or be formed by a column. Such a column may have a triangular cross-section and provide a prong seat (e.g., a surface) that allows, for a latched orientation, a prong to seat against a leg of the triangular cross-section of the column.

As described herein, a latch may have a substantially V-shape defined by a prong, an actuation surface and a pivot axis. In some examples, an end of a "V" and a pivot axis may be displaced (see, e.g., examples of FIG. 7). Such configurations may allow for proper latching, releasing, securing, etc., of an end of a handle to a base.

As described herein, an assembly can include a latch surface of a base that includes a bevel (or beveled surface) disposed at an angle and where a button includes a bevel (or beveled surface) disposed at approximately the same angle. As described herein, a swing end of a handle can include a bevel disposed at an angle and a latch surface of a base can include a bevel disposed at an approximately complimentary angle. In such an example, a button can include a bevel disposed at approximately the same angle as the latch surface of the base. In various examples, a bevel of a swing end of a handle may be a frame that defines an opening where a latching surface adjacent the opening allows for seating of a prong of a latch to lock the handle with respect to a base.

The term "circuit" or "circuitry" may be used herein (e.g., in the summary, description, and/or claims). As is well known in the art, the term "circuitry" includes all levels of available integration, e.g., from discrete logic circuits to the highest level of circuit integration such as VLSI, and includes programmable logic components programmed to perform the functions of an embodiment as well as general-purpose or special-purpose processors programmed with instructions to perform those functions. Such circuitry may optionally rely on one or more computer-readable media that includes computer-executable instructions. As described herein, a computer-readable medium may be a storage device (e.g., a memory card, a storage disk, etc.) and referred to as a computer-readable storage medium.

Figure 8:
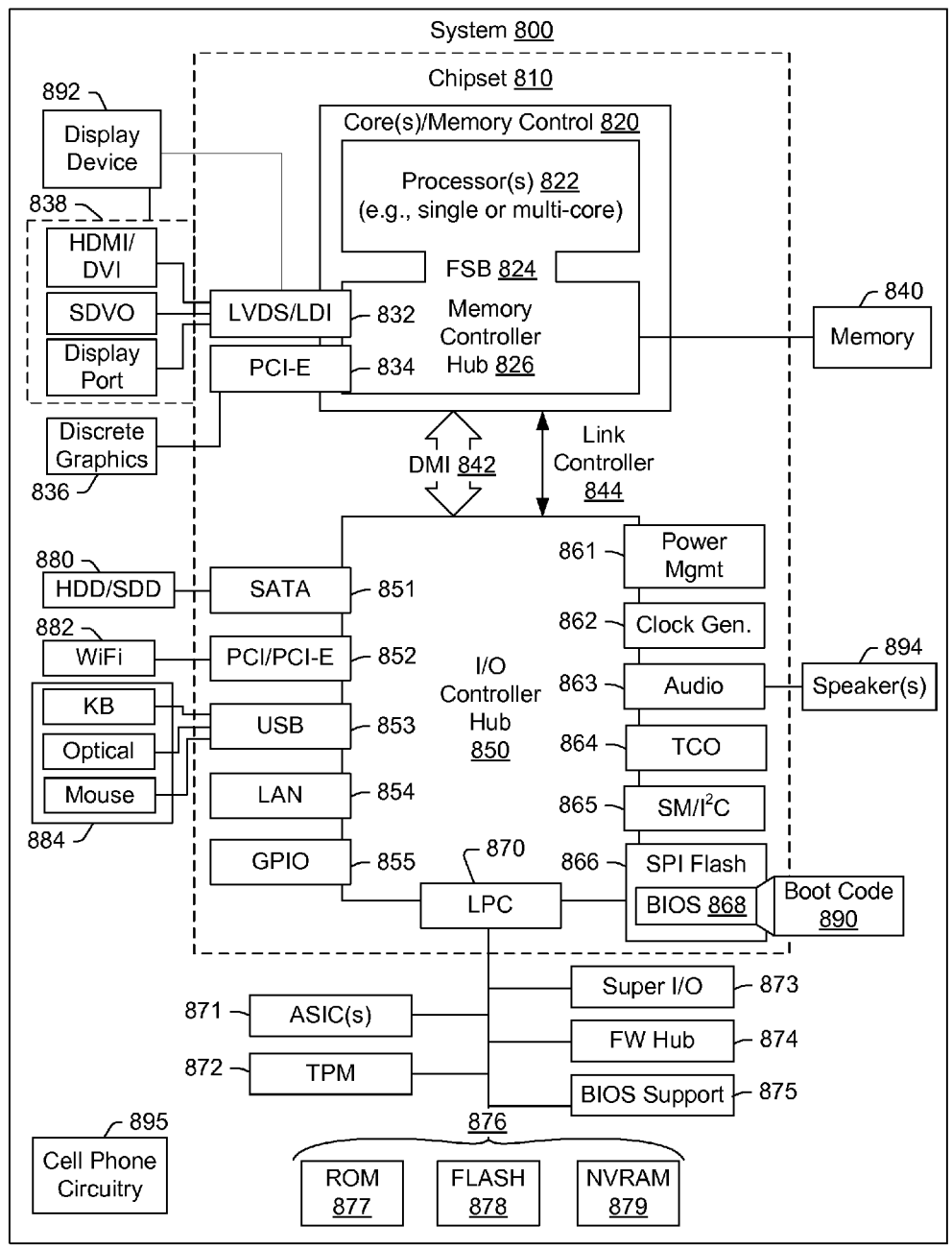
FIG. 8 is a diagram of an example of a machine.

While various examples of circuits or circuitry may be shown or discussed, FIG. 8 depicts a block diagram of an illustrative computer system 800. The system 800 may be a desktop computer system, such as one of the ThinkCentre® or ThinkPad® series of personal computers sold by Lenovo (US) Inc. of Morrisville, N.C., or a workstation computer, such as the ThinkStation® workstation computer sold by Lenovo (US) Inc. of Morrisville, N.C.; however, as apparent from the description herein, a satellite, a base, a server or other machine may include other features or only some of the features of the system 800 (e.g., consider the ThinkServer® server sold by Lenovo (US) Inc. of Morrisville, N.C.).

As shown in FIG. 8, the system 800 includes a so-called chipset 810. A chipset refers to a group of integrated circuits, or chips, that are designed to work together. Chipsets are usually marketed as a single product (e.g., consider chipsets marketed under the brands INTEL®, AMD®, etc.).

In the example of FIG. 8, the chipset 810 has a particular architecture, which may vary to some extent depending on brand or manufacturer. The architecture of the chipset 810 includes a core and memory control group 820 and an I/O controller hub 850 that exchange information (e.g., data, signals, commands, etc.) via, for example, a direct management interface or direct media interface (DMI) 842 or a link controller 844. In the example of FIG. 8, the DMI 842 is a chip-to-chip interface (sometimes referred to as being a link between a "northbridge" and a "southbridge").

The core and memory control group 820 include one or more processors 822 (e.g., single core or multi-core) and a memory controller hub 826 that exchange information via a front side bus (FSB) 824. As described herein, various components of the core and memory control group 820 may be integrated onto a single processor die, for example, to make a chip that supplants the conventional "northbridge" style architecture.

The memory controller hub 826 interfaces with memory 840. For example, the memory controller hub 826 may provide support for DDR SDRAM memory (e.g., DDR, DDR2, DDR3, etc.). In general, the memory 840 is a type of random-access memory (RAM). It is often referred to as "system memory".

The memory controller hub 826 further includes a low-voltage differential signaling interface (LVDS) 832. The LVDS 832 may be a so-called LVDS Display Interface (LDI) for support of a display device 892 (e.g., a CRT, a flat panel, a projector, etc.). A block 838 includes some examples of technologies that may be supported via the LVDS interface 832 (e.g., serial digital video, HDMI/DVI, display port). The memory controller hub 826 also includes one or more PCI-express interfaces (PCI-E) 834, for example, for support of discrete graphics 836. Discrete graphics using a PCI-E interface has become an alternative approach to an accelerated graphics port (AGP). For example, the memory controller hub 826 may include a 16-lane (×16) PCI-E port for an external PCI-E-based graphics card. A system may include AGP or PCI-E for support of graphics. As described herein, a display may be a sensor display (e.g., configured for receipt of input using a stylus, a finger, etc.). As described herein, a sensor display may rely on resistive sensing, optical sensing, or other type of sensing.

The I/O hub controller 850 includes a variety of interfaces. The example of FIG. 8 includes a SATA interface 851, one or more PCI-E interfaces 852 (optionally one or more legacy PCI interfaces), one or more USB interfaces 853, a LAN interface 854 (more generally a network interface), a general purpose I/O interface (GPIO) 855, a low-pin count (LPC) interface 870, a power management interface 861, a clock generator interface 862, an audio interface 863 (e.g., for speakers 894), a total cost of operation (TCO) interface 864, a system management bus interface (e.g., a multi-master serial computer bus interface) 865, and a serial peripheral flash memory/controller interface (SPI Flash) 866, which, in the example of FIG. 8, includes BIOS 868 and boot code 890. With respect to network connections, the I/O hub controller 850 may include integrated gigabit Ethernet controller lines multiplexed with a PCI-E interface port. Other network features may operate independent of a PCI-E interface.

The interfaces of the I/O hub controller 850 provide for communication with various devices, networks, etc. For example, the SATA interface 851 provides for reading, writing or reading and writing information on one or more drives 880 such as HDDs, SDDs or a combination thereof. The I/O hub controller 850 may also include an advanced host controller interface (AHCI) to support one or more drives 880. The PCI-E interface 852 allows for wireless connections 882 to devices, networks, etc. The USB interface 853 provides for input devices 884 such as keyboards (KB), one or more optical sensors, mice and various other devices (e.g., microphones, cameras, phones, storage, media players, etc.). On or more other types of sensors may optionally rely on the USB interface 853 or another interface (e.g., $I^2C$, etc.).

In the example of FIG. 8, the LPC interface 870 provides for use of one or more ASICs 871, a trusted platform module (TPM) 872, a super I/O 873, a firmware hub 874, BIOS support 875 as well as various types of memory 876 such as ROM 877, Flash 878, and non-volatile RAM (NVRAM) 879. With respect to the TPM 872, this module may be in the form of a chip that can be used to authenticate software and hardware devices. For example, a TPM may be capable of performing platform authentication and may be used to verify that a system seeking access is the expected system.

The system 800, upon power on, may be configured to execute boot code 890 for the BIOS 868, as stored within the SPI Flash 866, and thereafter processes data under the control of one or more operating systems and application software (e.g., stored in system memory 840). An operating system may be stored in any of a variety of locations and accessed, for example, according to instructions of the BIOS 868. Again, as described herein, a satellite, a base, a server or other machine may include fewer or more features than shown in the system 800 of FIG. 8. Further, the system 800 of FIG. 8 is shown as optionally including cell phone circuitry 895, which may include GSM, CDMA, etc., types of circuitry configured for coordinated operation with one or more of the other features of the system 800.

CONCLUSION

Although examples of methods, devices, systems, etc., have been described in language specific to structural features and/or methodological acts, it is to be understood that the subject matter defined in the appended claims is not necessarily limited to the specific features or acts described. Rather, the specific features and acts are disclosed as examples of forms of implementing the claimed methods, devices, systems, etc.

What is claimed is:

1. An assembly comprising:
    a base that comprises a front side, a back side, a hinge axis, a hinge end, an opposing end and a beveled surface disposed intermediate the hinge end and the opposing end wherein the beveled surface comprises an opening;
    a handle that rotates about the hinge axis and that comprises a front side, a back side, a hinge end and a swing end wherein the swing end comprises an angled frame that defines an opening for access to a surface;
    a button that comprises a latch contacting surface;
    a button spring that biases the button; and
    a latch that comprises a pivot axis, a latch spring, a prong biased by the latch spring about the pivot axis and an actuation surface wherein, for a latched orientation, the prong extends through the opening of the beveled surface and into the opening of the angled frame to access and contact the surface and to bias the swing end of the handle toward the base and wherein, for an unlatched orientation, the latch spring biases the actuation surface against the latch contacting surface of the button.

2. The assembly of claim 1 wherein the prong comprises a beveled surface that contacts the angled frame of the handle and, upon application of force to the handle, rotates the latch toward the opening of the beveled surface of the base.

3. The assembly of claim 1 wherein, about the pivot axis, the prong and the actuation surface define an acute angle.

4. The assembly of claim 1 wherein the latch comprises a throw of approximately 10 degrees about the pivot axis.

5. The assembly of claim 1 wherein, for the latched orientation, the button, upon application of force, contacts the actuation surface of the latch and rotates the latch about the pivot axis.

6. The assembly of claim 1 wherein the prong comprises a prong length, wherein the opening defined by the angled frame comprises an opening length and wherein the prong length exceeds approximately fifty percent of the opening length.

7. The assembly of claim 1 wherein the angled frame of the handle comprises a column that contacts the front side of the base.

8. The assembly of claim 7 wherein the prong contacts a surface of the column and wherein the base contacts an opposing surface of the column.

9. The assembly of claim 7 wherein the column comprises a triangular cross-section.

10. The assembly of claim 7 wherein the handle comprises a triangular grip formed in part by the column.

11. The assembly of claim 1 wherein, for the latched orientation, an edge of the button is directly adjacent to the swing end of the handle.

12. The assembly of claim 11 wherein, for the latched orientation, the edge of the button comprises a bevel that is at an angle complimentary to an angle of the angled frame of the handle.

13. An assembly comprising:
    one or more processors configured to execute instructions;
    memory configured to store processor-executable instructions;
    a media drive configured to store information and to respond to instructions executed by at least one of the one or more processors; and
    a subassembly that carries the media drive wherein the subassembly comprises
        a handle that rotates about a hinge axis and that comprises a front side, a back side, a hinge end and an opposing swing end wherein the swing end comprises an angled frame that defines an opening for access to a surface;
        a latch that comprises a pivot axis, a latch spring, a prong biased by the latch spring about the pivot axis and an actuation surface wherein, for a latched orientation, the prong extends into the opening of the angled frame to access and contact the surface to secure and bias the latch end of the handle; and
        a handle release button that comprises a button spring and a latch contacting surface that contacts the actuation surface of the latch and that rotates the prong out of the opening of the angled frame to release the latch end of the handle wherein, for an unlatched orientation, the latch spring biases the actuation surface against the latch contacting surface of the button.

14. The assembly of claim 13 wherein the handle comprises a grip formed in part by the angled frame.

15. The assembly of claim 13 wherein, for the latched orientation, the front side of the handle aligns with a front side of the handle release button.

16. The assembly of claim 13 wherein the latch comprises a substantially V-shape defined by the prong, the actuation surface and the pivot axis.

17. The assembly of claim 13 wherein the angled frame comprises a column wherein the column comprises a triangular cross-section.

18. The assembly of claim 17 wherein, for the latched orientation, the prong seats against a leg of the triangular cross-section of the column.

19. The assembly of claim 13 wherein, for the latched orientation, an edge of the handle release button is directly adjacent to the swing end of the handle.

20. The assembly of claim 19 wherein, for the latched orientation, the edge of the handle release button comprises a bevel that is at an angle complimentary to an angle of the angled frame of the handle.

* * * * *